US008432386B2

(12) United States Patent
Hsu

(10) Patent No.: US 8,432,386 B2
(45) Date of Patent: Apr. 30, 2013

(54) SWITCH DEVICE FOR SOURCE DRIVER OF LIQUID CRYSTAL DISPLAY AND OPERATING METHOD THEREOF

(75) Inventor: Chen-Ming Hsu, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 386 days.

(21) Appl. No.: 12/777,386

(22) Filed: May 11, 2010

(65) Prior Publication Data

US 2011/0279428 A1 Nov. 17, 2011

(51) Int. Cl.

| | |
|---|---|
| ***G06F 3/038*** | (2006.01) |
| ***G09G 5/00*** | (2006.01) |
| ***G09G 3/36*** | (2006.01) |
| ***H03B 1/00*** | (2006.01) |
| ***H03K 5/00*** | (2006.01) |
| ***H04B 1/10*** | (2006.01) |
| ***G11C 7/00*** | (2006.01) |

(52) U.S. Cl.
USPC .............. 345/210; 345/95; 327/554; 365/203

(58) Field of Classification Search .................. 307/116; 326/81; 327/108, 175, 554, 563, 94; 330/253, 330/257; 331/17; 341/143; 345/211; 361/246; 365/185.23, 189.11, 203, 205; 714/726
See application file for complete search history.

(56) References Cited

U.S. PATENT DOCUMENTS

2002/0021606 A1* 2/2002 Tsuchi .......................... 365/203
2010/0321105 A1* 12/2010 Romero ........................ 327/554

* cited by examiner

*Primary Examiner* — Quan-Zhen Wang
*Assistant Examiner* — Lin Li
(74) *Attorney, Agent, or Firm* — McClure, Qualey & Rodack, LLP

(57) ABSTRACT

A switch device for source drivers of liquid crystal displays includes a first switch module; a first switch; a second switch; a second switch module; a third switch module; a fourth switch module; a third switch; and a fourth switch; wherein when a first driving signal with a voltage level between a first voltage level and a second voltage level through the second switch module is sent to a second output terminal and a second driving signal with a voltage level between a third voltage level and a fourth voltage level through the third switch module is sent to a first output terminal, the first switch is turned on such that a first node is connected to a first voltage source with the first voltage level and the fourth switch is turned on such that a second node is connected to a fourth voltage source with the fourth voltage level.

9 Claims, 5 Drawing Sheets

SWITCH DEVICE FOR SOURCE DRIVER OF LIQUID CRYSTAL DISPLAY AND OPERATING METHOD THEREOF

FIELD OF THE INVENTION

The present invention relates to a switch device and operating method thereof and in particular relates to a switch device for a source driver of a liquid crystal display and operating method thereof.

DESCRIPTION OF THE RELATED ART

Conventionally, a switch device is used in a source driver of a liquid crystal display. The switch device is made up of two pairs of switches. There are three types of switches: a high-voltage switch, a middle-voltage switch and a low-voltage switch. The sizes of high-voltage switches are larger than those of middle-voltage switches and the sizes of the middle-voltage switches are larger than those of low-voltage switches. Conventionally, high-voltage switches are normally used because the voltage across the switches may be up to six volts, which would be maximum acceptable limit of middle-voltage switches. As a result, the size of the switch device is large, and cost of the switch device is high.

FIG. 1 is a schematic diagram showing a conventional switch device in a source driver of a liquid crystal display. The switch device 110 includes a first switch 112, a second switch 114, a third switch 116, a fourth switch 118 and an inverter 120.

As an example, the voltage range at the first input terminal A1 is between 5 volts and 0 volts, and the voltage range at the second input terminal A2 is between 10 volts and 5 volts. When the second switch 114 and the fourth switch 118 are turned on, the signal at the first input terminal A1 is sent to the second output terminal S2 and the signal at the second input terminal A2 node is sent to the first output terminal S1. As a result, the potential across the first switch 112, is from 0 volts to 10 volts, which is the same as the potential across the third switch 116. Similarly, assuming that the voltage range at the first input terminal A1 is between 5 volts and 0 volts, and the voltage range at the second input terminal A2 is between 10 volts and 5 volts. When the first switch 112 and the third switch 116 are turned on, the potential across the second switch 114 is from 0 volts to 10 volts, which is the same as the potential across the fourth switch 118. Thus, the conventional switch device requires high-voltage switches.

Thus, a switch device that is made up of small-sized switches, which is capable of achieving the same performance as the conventional switch device is called for.

BRIEF SUMMARY OF INVENTION

A detailed description is given in the following embodiments with reference to the accompanying drawings.

The present invention provides a switch device for a source driver of a liquid crystal display. The switch device comprises: a first switch module having a first semiconductor switch and a second semiconductor switch connected between a first input terminal and a first output terminal, wherein the first semiconductor switch is connected to the second semiconductor switch via a first node; a first switch connected between the first node and a first voltage source; a second switch connected between the first node and a second voltage source; a second switch module connected between the first input terminal and a second output terminal; a third switch module connected between a second input terminal and the first output terminal; a fourth switch module having a third semiconductor switch and a fourth semiconductor switch connected between the second input terminal and the second output terminal, wherein the third semiconductor switch is connected to the fourth semiconductor switch via a second node; a third switch connected between the second node and the third voltage source; and a fourth switch connected between the second node and the fourth voltage source, wherein when a first driving signal with a voltage level between a first voltage level and a second voltage level at the first input terminal, through the second switch module, is sent to the second output terminal and a second driving signal with a voltage level between a third voltage level and a fourth voltage level at the second input terminal, through the third switch module, is sent to the first output terminal, the first switch is turned on such that the first node is connected to the first voltage source with the first voltage level and the fourth switch is turned on such that the second node is connected to the fourth voltage source with the fourth voltage level.

The present invention provides a method for operating a switch device for a source driver of a liquid crystal display. The method comprises: providing a first driving signal at a first input terminal; providing a second driving signal at a second input terminal; providing a first switch module having a first semiconductor switch and a second semiconductor switch connected between the first input terminal and a first output terminal, wherein the first semiconductor switch is connected to the second semiconductor switch via a first node; providing a fourth switch module having a third semiconductor switch and a fourth semiconductor switch connected between the second input terminal and a second output terminal, wherein the third semiconductor switch is connected to the fourth semiconductor switch via a second node; transmitting the first driving signal to the second output terminal through a second switch module and the second driving signal to the first output terminal through a third switch module; and turning on a first switch such that the first node is connected to the first voltage source with a first voltage level and turning on a fourth switch such that the second node is connected to the fourth voltage source with a fourth voltage level when the first driving signal is a voltage level between the first voltage level and a second voltage level and the second driving signal is a voltage level between a third voltage level and the fourth voltage level.

The above-mentioned switch device for a source driver of a liquid crystal display and operating method thereof not only has small size, but may also be implemented for AC common voltage and DC common voltage operations.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
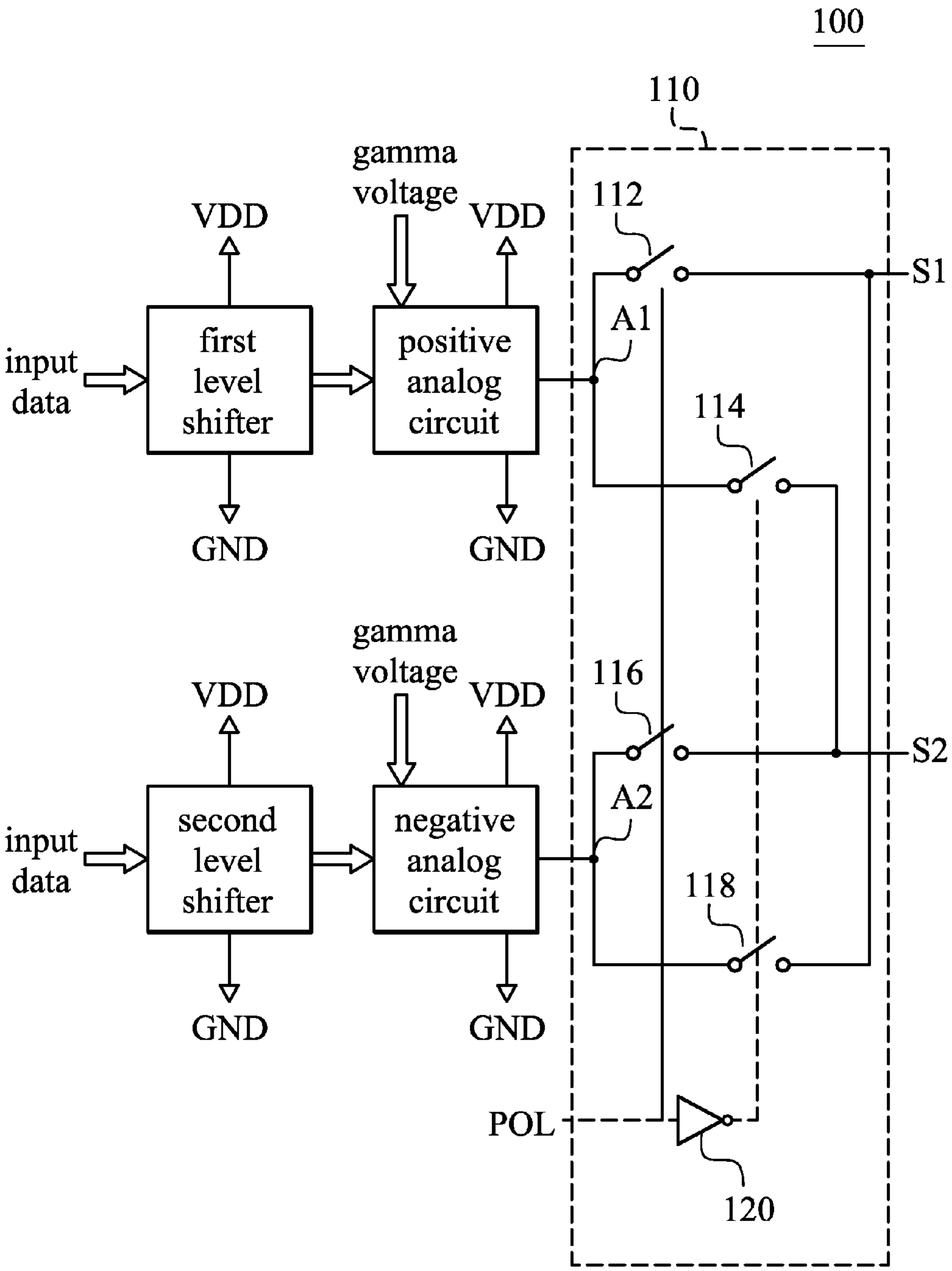
FIG. 1 is a schematic diagram showing a conventional switch device in a source driver of a liquid crystal display.
Figure 2:
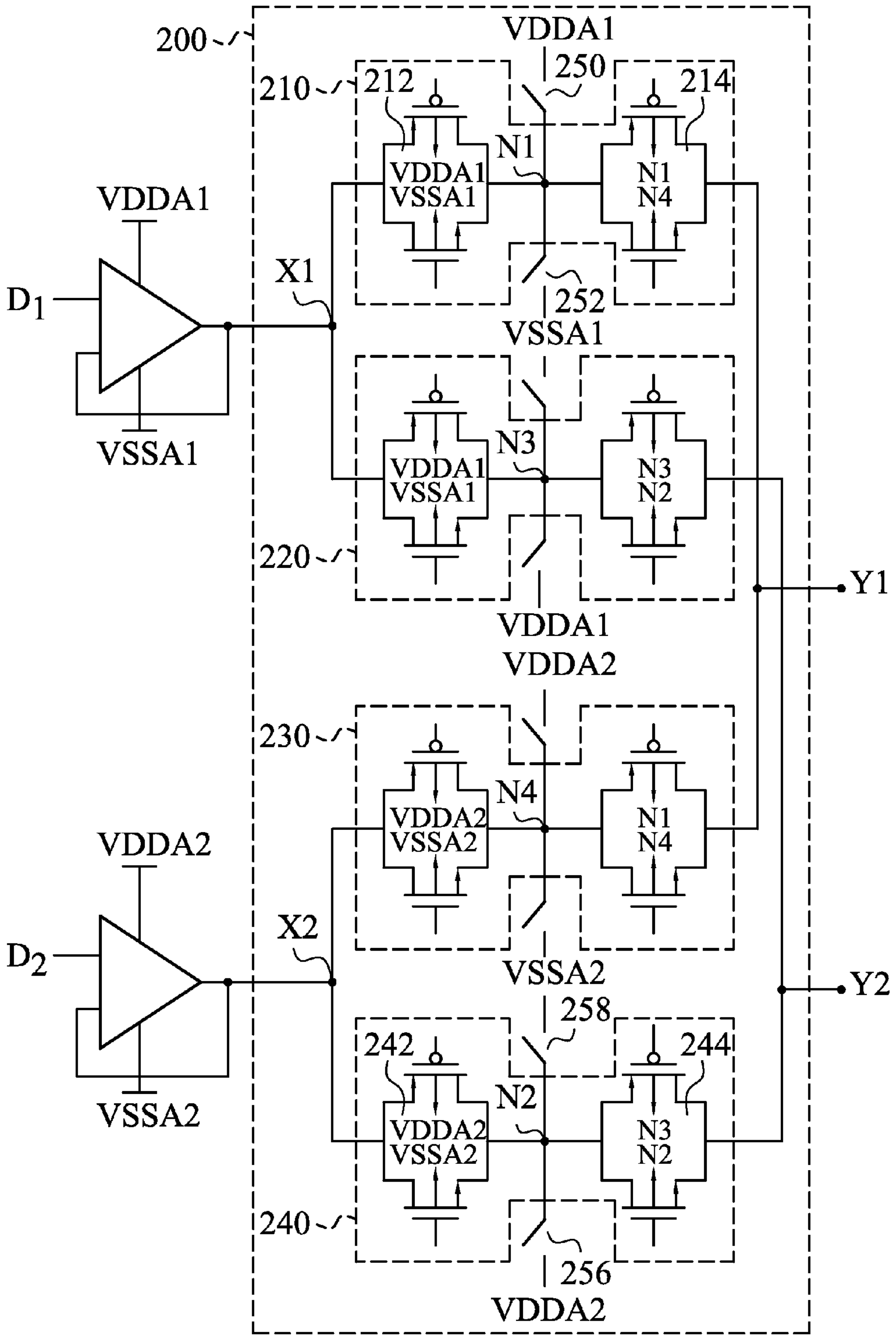
FIG. 2 is a schematic diagram showing a switch device in a source driver of a liquid crystal display of the invention.

FIG. 2 is a schematic diagram showing a switch device in a source driver of a liquid crystal display of the invention. The switch device 200 includes a first switch module 210, a second switch module 220, a third switch module 230, a fourth switch module 240, a first switch 250, a second switch 252, a third switch 256 and a fourth switch 258. The first switch module 210 has a first semiconductor switch 212 and a second semiconductor switch 214, and is connected between a first input terminal X1 and a first output terminal Y1. The first semiconductor switch 212 is connected to the second semiconductor switch 214 via a first node N1. The semiconductor switch may be CMOS transmission gates, but is not limited thereto.

The first switch 250 is connected between the first node N1 and a first voltage source VDDA1. The second switch 252 is connected between the first node N1 and a second voltage source VSSA1.

The second switch module 220 is connected between the first input terminal X1 and a second output terminal Y2. The third switch module 230 is connected between a second input terminal X2 and the first output terminal Y1.

The fourth switch module 240 has a third semiconductor switch 242 and a fourth semiconductor switch 244 and is connected between the second input terminal X2 and the second output terminal Y2. The third semiconductor switch 242 is connected to the fourth semiconductor switch 244 via a second node.

The third switch 256 is connected between the second node N2 and a third voltage source VDDA2. The fourth switch 258 is connected between the second node N2 and a fourth voltage source VSSA2.

In one embodiment, when a first driving signal with a voltage level between a first voltage level and a second voltage level at the first input terminal, through the second switch module 220, is sent to the second output terminal Y2 and a second driving signal with a voltage level between a third voltage level and a fourth voltage level at the second input terminal, through the third switch module 230, is sent to the first output terminal Y1, the first switch 250 is turned on such that the first node N1 is connected to the first voltage source VDDA1 with the first voltage level and the fourth switch 258 is turned on such that the second node N2 is connected to the fourth voltage source VDDA2 with the fourth voltage level.

In one embodiment, usually, the first voltage level is larger than the second voltage level, and the third voltage level is larger than the fourth voltage level. The difference in voltage levels between the first voltage level and the second voltage level is equal to the difference in voltage levels between the third voltage level and the fourth voltage level.

Figure 3:
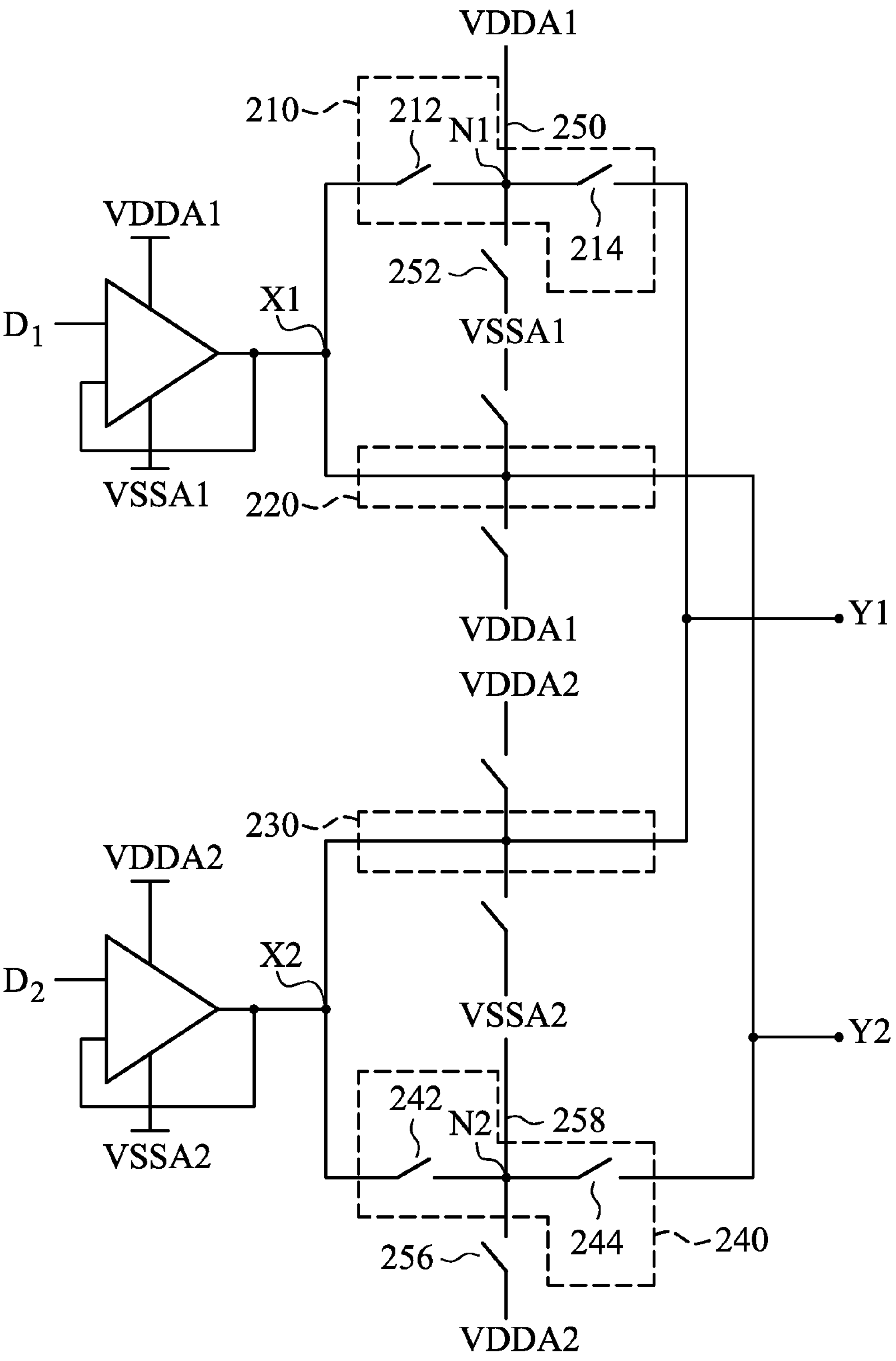
FIG. 3 is a diagram showing a first operative type of the switch device of FIG. 2.

FIG. 3 is a diagram showing a first operative type of the switch device of FIG. 2. For example, the first voltage source VDDA1 is 5 volts, the second voltage source VSSA1 is 0 volts, the third voltage source VDDA2 is 10 volts, and the fourth voltage source VSSA2 is 5 volts. The first switch module 210 and the fourth switch module 240 are turned off, and the second switch module 220 and the third switch module 230 are turned on so that the first driving signal with a voltage level between 5 volts and 0 volts is delivered to the second output terminal Y2, and the second driving signal with a voltage level between 10 volts and 5 volts is delivered to the first output terminal Y1. The potential between the first input terminal X1 and the first output terminal Y1 (i.e. potential across the first switch module 210) may be from 0 to 10 volts, which is the same as the potential between the second input terminal X2 and the second output terminal Y2 (i.e. the potential across the fourth switch module 240). In this case, the first switch 250 is operated to be turned on so that the first node N1 is connected to the first voltage source VDDA1 with 5 volts. Also, the fourth switch 258 is also operated to be turned on so that the second node N2 is connected to the fourth voltage source VSSA2 with 5 volts. In this manner, the potential across the first semiconductor switch 212 (between the first input terminal X1 and the first node N1) is limited to between 0-5 volts, which is the same as the potential across the second semiconductor switch 214, the third semiconductor switch 242 and the fourth semiconductor switch 244.

In another embodiment, when the first driving signal with a voltage level between the third voltage level and the fourth voltage level at the first input terminal X1 is through the second switch module 220, is sent to the second output terminal Y2 and the second driving signal with a voltage level between the first voltage level and the second voltage level at the second input terminal X2 is through the third switch module 230, is sent to the first output terminal Y1, the second switch 252 is turned on such that the first node N1 is connected to the second voltage source VSSA1 with the fourth voltage level and the third switch is turned on such that the second node N2 is connected to the third voltage source VDDA2 with the first voltage level.

Figure 4:
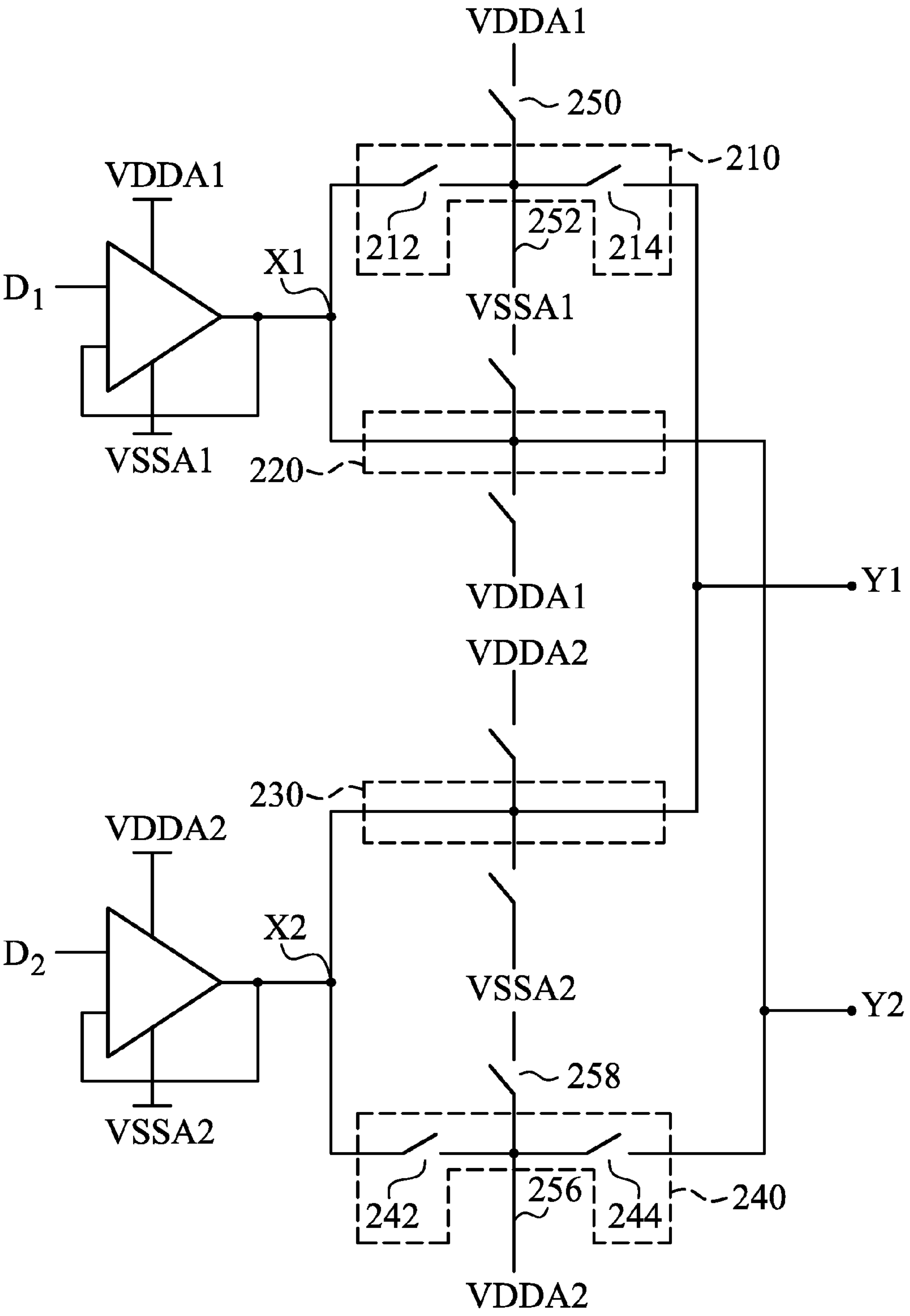
FIG. 4 is a diagram showing a second operative type of the switch device of FIG. 2.

FIG. 4 is a diagram showing a second operative type of the switch device of FIG. 2. For example, the first voltage source VDDA1 is 10 volts, the second voltage source VSSA1 is 5 volts, the third voltage source VDDA2 is 5 volts, and the fourth voltage source VSSA2 is 0 volts. The first switch module 210 and the fourth switch module 240 are turned off, and the second switch module 220 and the third switch module 230 are turned on so that the first driving signal with a voltage level between 10 volts and 5 volts is delivered to the second output terminal Y2, and the second driving signal with a voltage level between 5 volts and 0 volts is delivered to the first output terminal Y1. The potential between the first input terminal X1 and the first output terminal Y1 (i.e. the potential across the first switch module 210) may be from 0 to 10 volts, which is the same as the potential between the second input terminal X2 and the second output terminal Y2 (i.e. the potential across the fourth switch module 240). In this case, the second switch 252 is operated to be turned on so that the first node N1 is connected to the second voltage source VSSA1 with 5 volts. Also, the third switch 256 is also operated to be turned on so that the second node N2 is connected to the third voltage source VDDA2 with 5 volts. In this manner, the potential across the first semiconductor switch 212 (between the first input terminal X1 and the first node N1) is limited to between 0-5 volts, which is the same as the potential across the second semiconductor switch 214, the third semiconductor switch 242 and the fourth semiconductor switch 244.

FIG. 2 shows a third type of switch device. For example, the first voltage source VDDA1 is 5 volts, the second voltage source VSSA1 is 0 volts, the third voltage source VDDA2 is 5 volts, and the fourth voltage source VSSA2 is 0 volts. The driving signals at the first input terminal X1 and the second input terminal X2 are between 0-5 volts, which is the same as the output signals (i.e. so-called DC common voltage) at the first output terminal Y1 and the second output terminal Y2. Thus, the potentials across the first switch module 210, the second switch module 220, the third switch module 230 and the fourth switch module 240 are between 0-5 volts.

Figure 5:
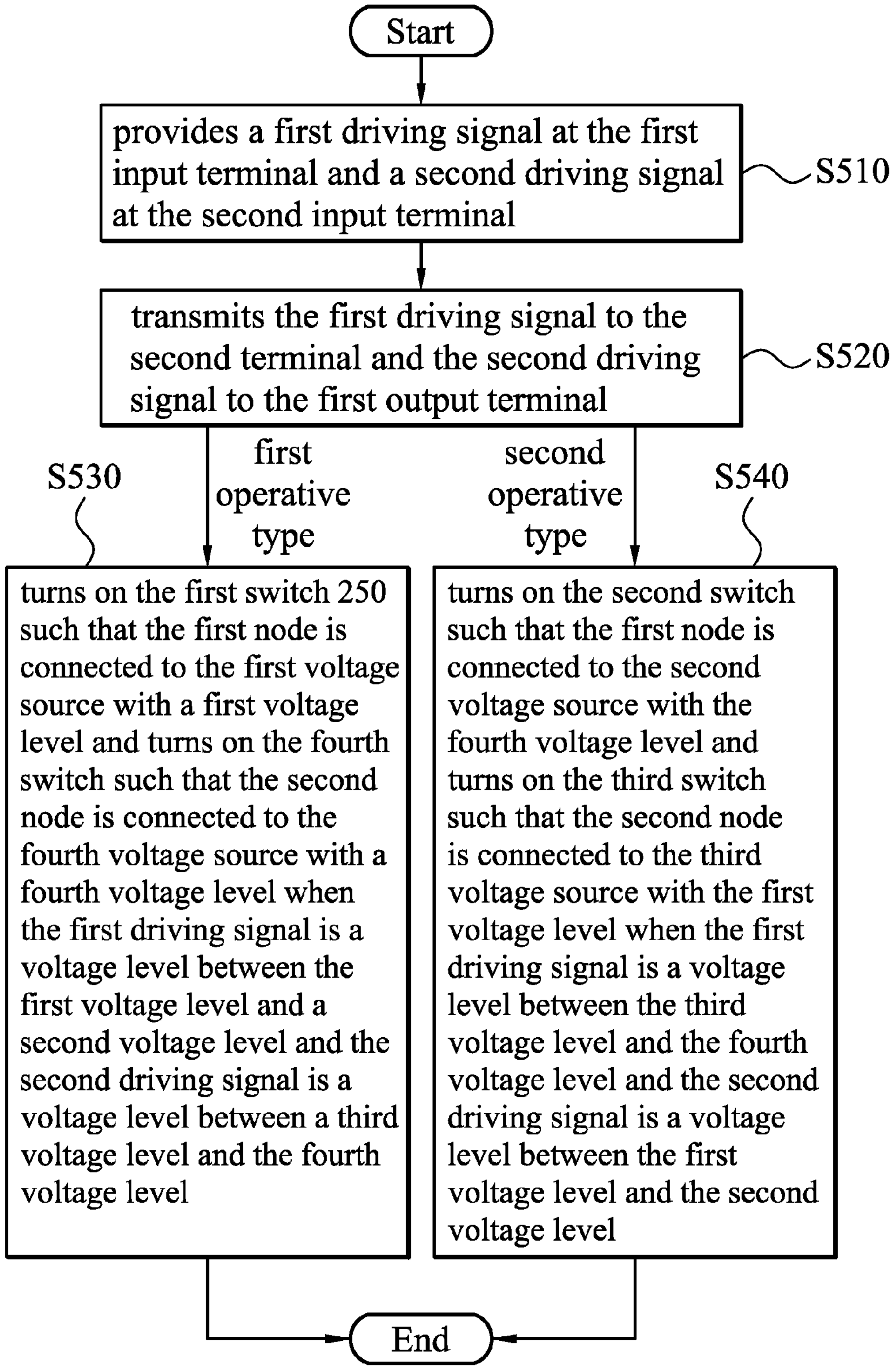
FIG. 5 is a flowchart illustrating a method for operating the switch device of a source driver of a liquid crystal display of the invention.

FIG. 5 is a flowchart illustrating a method for operating the switch device of a source driver of a liquid crystal display of the invention. In step 510, a first driving signal at the first input terminal X1 and a second driving signal at the second input terminal X2 are provided. Next, the first driving signal is transmitted to the second output terminal Y2 through the second switch module 220 and the second driving signal is transmitted to the first output terminal Y1 through the third switch module 230 in step 520.

In a first operative type, in step 530, the first switch 250 is turned on such that the first node N1 is connected to the first voltage source VDDA1 with a first voltage level and the fourth switch 258 is turned on such that the second node N2 is connected to the fourth voltage source VSSA2 with a fourth voltage level when the first driving signal is a voltage level between the first voltage level and a second voltage level and the second driving signal is a voltage level between a third voltage level and the fourth voltage level.

In a second operative type, in step 540, the second switch 252 is turned on such that the first node N1 is connected to the second voltage source VSSA1 with the fourth voltage level and the third switch 256 is turned on such that the second node N2 is connected to the third voltage source VDDA2 with the first voltage level when the first driving signal is a voltage level between the third voltage level and the fourth voltage level and the second driving signal is a voltage level between the first voltage level and the second voltage level.

When the first switch module 210 and the fourth switch module 240 are turned on, and the second switch module 220 and the third switch module 230 are turned off, the potential between the first input terminal X1 and the first output terminal Y1 (i.e. the potential across the second switch module 220) is constantly between 0 and 5 volts, which is the same as the potential between the second input terminal X2 and the second output terminal Y2 (i.e. the potential across the third switch module 230), as long as the difference in voltage levels between the first voltage source VDDA1 and the second voltage source VSSA1 and the difference in voltage levels between the third voltage source VDDA2 and the fourth voltage source VSSA2 are 5 volts.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switch device for a source driver of a liquid crystal display, comprising:

a first switch module having a first semiconductor switch and a second semiconductor switch connected between a first input terminal and a first output terminal, wherein the first semiconductor switch is connected to the second semiconductor switch via a first node;

a first switch connected between the first node and a first voltage source;

a second switch connected between the first node and a second voltage source;

a second switch module connected between the first input terminal and a second output terminal;

a third switch module connected between a second input terminal and the first output terminal;

a fourth switch module having a third semiconductor switch and a fourth semiconductor switch connected between the second input terminal and the second output terminal, wherein the third semiconductor switch is connected to the fourth semiconductor switch via a second node;

a third switch connected between the second node and the third voltage source; and a fourth switch connected between the second node and the fourth voltage source, wherein when a first driving signal with a voltage level between a first voltage level and a second voltage level at the first input terminal, through the second switch module, is sent to the second output terminal and a second driving signal with a voltage level between a third voltage level and a fourth voltage level at the second input terminal, through the third switch module, is sent to the first output terminal, the first switch is turned on such that the first node is connected to the first voltage source with the first voltage level and the fourth switch is turned on such that the second node is connected to the fourth voltage source with the fourth voltage level.

2. The device as claimed in claim 1, wherein when the first driving signal with a voltage level between the third voltage level and the fourth voltage level at the first input terminal, through the second switch module, is sent to the second output terminal and the second driving signal with a voltage level between the first voltage level and the second voltage level at the second input terminal, through the third switch module, is sent to the first output terminal, the second switch is turned on such that the first node is connected to the second voltage source with the fourth voltage level, and the third switch is turned on such that the second node is connected to the third voltage source with the first voltage level.

3. The device as claimed in claim 1, wherein the first voltage level is larger than the second voltage level, and the third voltage level is larger than the fourth voltage level.

4. The device as claimed in claim 3, wherein the difference in voltage levels between the first voltage level and the second voltage level is equal to the difference in voltage levels between the third voltage level and the fourth voltage level.

5. The device as claimed in claim 1, wherein each semiconductor switch comprises a CMOS transmission gate.

6. A method for operating a switch device for a source driver of a liquid crystal display, comprising:

providing a first driving signal at a first input terminal;

providing a second driving signal at a second input terminal;

providing a first switch module having a first semiconductor switch and a second semiconductor switch connected between the first input terminal and a first output terminal, wherein the first semiconductor switch is connected to the second semiconductor switch via a first node;

providing a fourth switch module having a third semiconductor switch and a fourth semiconductor switch connected between the second input terminal and a second output terminal, wherein the third semiconductor switch is connected to the fourth semiconductor switch via a second node;

transmitting the first driving signal to the second output terminal through a second switch module and the second driving signal to the first output terminal through a third switch module;

turning on a first switch such that the first node is connected to the first voltage source with a first voltage level and turning on a fourth switch such that the second node is connected to the fourth voltage source with a fourth voltage level when the first driving signal is a voltage level between the first voltage level and a second voltage level and the second driving signal is a voltage level between a third voltage level and the fourth voltage level and when the first semiconductor switch, the second semiconductor switch, the third semiconductor switch and the fourth semiconductor switch turn off.

7. The method as claimed in claim 6, further comprising:

turning on a second switch such that the first node is connected to the second voltage source with the fourth voltage level and turning on a third switch such that the second node is connected to the third voltage source with the first voltage level when the first driving signal is a voltage level between the third voltage level and the fourth voltage level and the second driving signal is a voltage level between the first voltage level and the second voltage level.

8. The method as claimed in claim 6, further comprising:

making the first voltage level larger than the second voltage level, and the third voltage level larger than the fourth voltage level.

9. The method as claimed in claim 8, further comprising:

making the difference in voltage levels between the first voltage level and the second voltage level equal to the difference in voltage levels between the third voltage level and the fourth voltage level.

* * * * *